US009596529B2

United States Patent
Kappus et al.

(10) Patent No.: US 9,596,529 B2
(45) Date of Patent: Mar. 14, 2017

(54) PARAMETRIC TRANSDUCER WITH ADAPTIVE CARRIER AMPLITUDE

(71) Applicant: Turtle Beach Corporation, Poway, CA (US)

(72) Inventors: Brian Alan Kappus, San Diego, CA (US); Elwood Grant Norris, Poway, CA (US)

(73) Assignee: Turtle Beach Corporation, San Diego, CA (US)

(*) Notice: Subject to any disclaimer, the term of this patent is extended or adjusted under 35 U.S.C. 154(b) by 0 days.

(21) Appl. No.: 14/518,258

(22) Filed: Oct. 20, 2014

(65) Prior Publication Data

US 2015/0256909 A1 Sep. 10, 2015

Related U.S. Application Data

(60) Provisional application No. 61/893,593, filed on Oct. 21, 2013.

(51) Int. Cl.
| | |
|---|---|
| *H04H 40/54* | (2008.01) |
| *H04R 1/00* | (2006.01) |
| *H04R 3/00* | (2006.01) |
| *H03F 3/19* | (2006.01) |

(52) U.S. Cl.
CPC ............... *H04R 1/00* (2013.01); *H03F 3/19* (2013.01); *H04R 3/00* (2013.01); *H03F 2200/03* (2013.01); *H04R 2217/03* (2013.01)

(58) Field of Classification Search
USPC ............ 381/4, 6, 77, 79, 111, 120; 367/137; 310/322
See application file for complete search history.

(56) References Cited

U.S. PATENT DOCUMENTS

| | | | |
|---|---|---|---|
| 2003/0091203 A1 | 5/2003 | Croft et al. | |
| 2005/0207590 A1* | 9/2005 | Niehoff | G10K 15/02 381/77 |
| 2005/0244016 A1 | 11/2005 | Norris et al. | |
| 2005/0248233 A1* | 11/2005 | Pompei | G10K 15/02 310/322 |
| 2012/0051556 A1 | 3/2012 | Pompei | |
| 2013/0121500 A1 | 5/2013 | Lamb et al. | |

OTHER PUBLICATIONS

A. Bruce Carlson, Communicaton Systems, 4th Edition, McGraw Hill, ISBN 0-07-011127-8, 2002, Chapter 2, p. 23.*
International Search Report and the Written Opinion for International App No. PCT/US2014/061417, mailed Jan. 20, 2015, Authorized Officer: Wagner, Judit.

* cited by examiner

*Primary Examiner* — Vivian Chin
*Assistant Examiner* — Friedrich W Fahnert
(74) *Attorney, Agent, or Firm* — Sheppard Mullin Richter & Hampton LLP

(57) ABSTRACT

An ultrasonic emitter system includes a digital processing system for adjusting the amplitude of an ultrasonic carrier signal to increase audio levels of an audio signal during lower power portions of the audio signal. To increase the audio levels without introducing unwanted audio and/or distortion, an additive constant is added to the ultrasonic carrier signal based on a rolling average audio signal power measurement.

20 Claims, 5 Drawing Sheets

PARAMETRIC TRANSDUCER WITH ADAPTIVE CARRIER AMPLITUDE

CROSS-REFERENCE TO RELATED APPLICATIONS

This application claims the benefit of Provisional Patent Application Ser. No. 61/893,593 filed on Oct. 21, 2013, which is hereby incorporated herein by reference in its entirety.

TECHNICAL FIELD

The present disclosure relates generally to parametric speakers for a variety of applications. More particularly, some embodiments relate to an ultrasonic emitter system with adaptive carrier amplitude.

BACKGROUND OF THE INVENTION

Non-linear transduction results from the introduction of sufficiently intense, audio-modulated ultrasonic signals into an air column. Self-demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

Parametric audio reproduction systems produce sound through the heterodyning of two acoustic signals in a non-linear process that occurs in a medium such as air. The acoustic signals are typically in the ultrasound frequency range. The non-linearity of the medium results in acoustic signals produced by the medium that are the sum and difference of the acoustic signals. Thus, two ultrasound signals that are separated in frequency can result in a difference tone that is within the approximate 20 Hz to 20,000 Hz range of human hearing.

SUMMARY

Embodiments of the technology described herein include an ultrasonic emitter system with adaptive carrier amplitude. In accordance with one embodiment, a method comprises determining an average power level of an audio signal. The method further comprises determining if additional power can be added to a carrier signal to be modulated by the audio signal. Upon a determination that additional power can be included in the carrier signal, the method can further comprise adding a constant value to effectuate the addition of the power. Upon a determination that power cannot be added to the carrier signal, one of maintaining a current carrier signal level or dropping the carrier signal down by subtracting the constant value from the carrier signal to effectuate a reduction in power of the carrier signal.

In accordance with another embodiment, a non-transitory computer-readable medium has computer executable program code embodied thereon, the computer executable program code configured to cause a computer system to: sample consecutive portions of an audio signal for modulating an ultrasonic carrier signal; determine an average power level of each of the consecutive portions of the audio signal; and determine if additional power can be added to the ultrasonic carrier signal at each of the consecutive portions of the audio signal, wherein upon a determination that additional power can be included in the carrier signal, adding a constant value to effectuate the addition of the power, and wherein upon a determination that power cannot be added to the ultrasonic carrier signal, one of maintaining a current ultrasonic carrier signal level or dropping the ultrasonic carrier signal down by subtracting the constant value from the ultrasonic carrier signal to effectuate a reduction in power of the ultrasonic carrier signal.

In accordance with yet another embodiment, an ultrasonic emitter comprises a backing plate. The ultrasonic emitter further comprises a flexible layer disposed adjacent the backing plate, the backing plate and the flexible layer each configured to be electrically coupled to a respective one of a pair of signal lines carrying an audio modulated ultrasonic carrier signal, wherein upon application of the audio modulated ultrasonic carrier signal, the flexible layer is configured to launch a pressure-wave representation of the audio modulated ultrasonic carrier signal into the air. Further still, the ultrasonic emitter comprises a digital signal processing system configured to increase the power level of an audio signal for modulating an ultrasonic carrier signal resulting in the audio modulated ultrasonic carrier signal upon a determination that the power level of the audio signal is less than a maximum drive power for driving the ultrasonic emitter.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the accompanying figures. The drawings are provided for purposes of illustration only and merely depict typical or example embodiments of the invention. These drawings are provided to facilitate the reader's understanding of the systems and methods described herein, and shall not be considered limiting of the breadth, scope, or applicability of the claimed invention.

Some of the figures included herein illustrate various embodiments of the invention from different viewing angles. Although the accompanying descriptive text may refer to elements depicted therein as being on the "top," "bottom" or "side" of an apparatus, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DESCRIPTION

Embodiments of the systems and methods described herein provide a HyperSonic Sound (also referred to as Hypersound) (HSS) audio system or other ultrasonic audio system for a variety of different applications. Certain embodiments provide an ultrasonic emitter system with an adaptive amplitude carrier signal. Various embodiments of the systems and methods disclosed herein can be implemented in any of a number of different types of ultrasonic audio reproduction systems.

Figure 1:
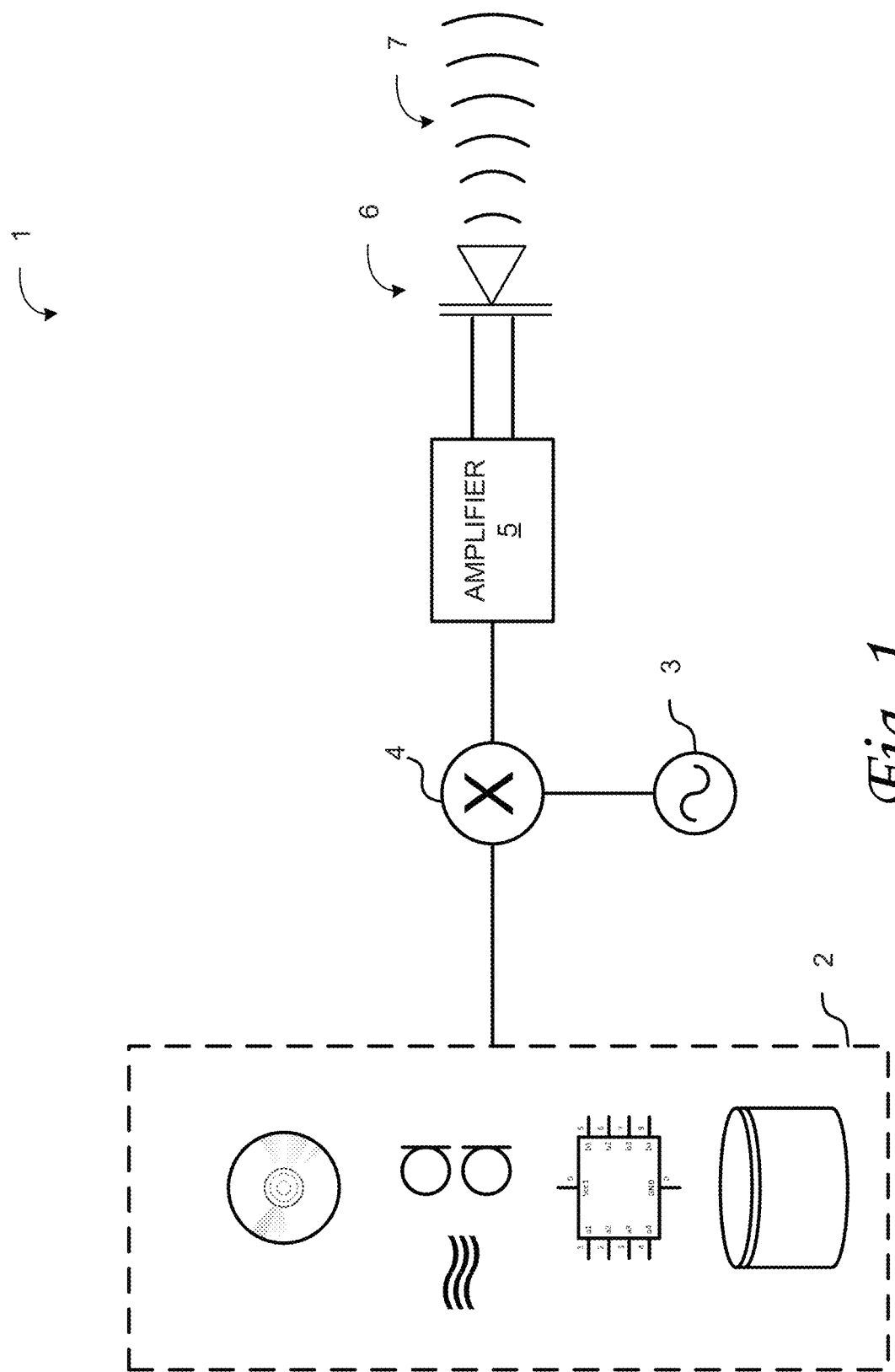
FIG. 1 is a diagram illustrating an ultrasonic sound system suitable for use with the emitter technology described herein.

FIG. 1 is a diagram illustrating an example ultrasonic sound system suitable for use in conjunction with the systems and methods described herein. In this exemplary ultrasonic system 1, audio content from an audio source 2, such as, for example, a microphone, memory, a data storage device, streaming media source, MP3, CD, DVD, set-top-box, or other audio source is received. The audio content may be decoded and converted from digital to analog form, depending on the source. The audio content received by the audio system 1 is modulated onto an ultrasonic carrier of frequency f1, using a modulator. The modulator typically includes a local oscillator 3 to generate the ultrasonic carrier signal, and multiplier 4 to modulate the audio signal on the carrier signal. The resultant signal is a double- or single-sideband signal with a carrier at frequency f1 and one or more side lobes. In some embodiments, the signal is a parametric ultrasonic wave or a HSS signal. In most cases, the modulation scheme used is amplitude modulation, or AM, although other modulation schemes can be used as well. Amplitude modulation can be achieved by multiplying the ultrasonic carrier by the information-carrying signal, which in this case is the audio signal. The spectrum of the modulated signal can have two sidebands, an upper and a lower side band, which are symmetric with respect to the carrier frequency, and the carrier itself.

The modulated ultrasonic signal is provided to the transducer (emitter) 6, which launches the ultrasonic signal into the air creating ultrasonic wave 7. When played back through the emitter at a sufficiently high sound pressure level, due to nonlinear behavior of the air through which it is 'played' or transmitted, the carrier in the signal mixes with the sideband(s) to demodulate the signal and reproduce the audio content. This is sometimes referred to as self-demodulation. Thus, even for single-sideband implementations, the carrier is included with the launched signal so that self-demodulation can take place.

Although the system illustrated in FIG. 1 uses a single emitter to launch a single channel of audio content, one of ordinary skill in the art after reading this description will understand how multiple mixers, amplifiers and emitters can be used to transmit multiple channels of audio using ultrasonic carriers. The ultrasonic emitters can be mounted in any desired location depending on the application.

Figure 2:
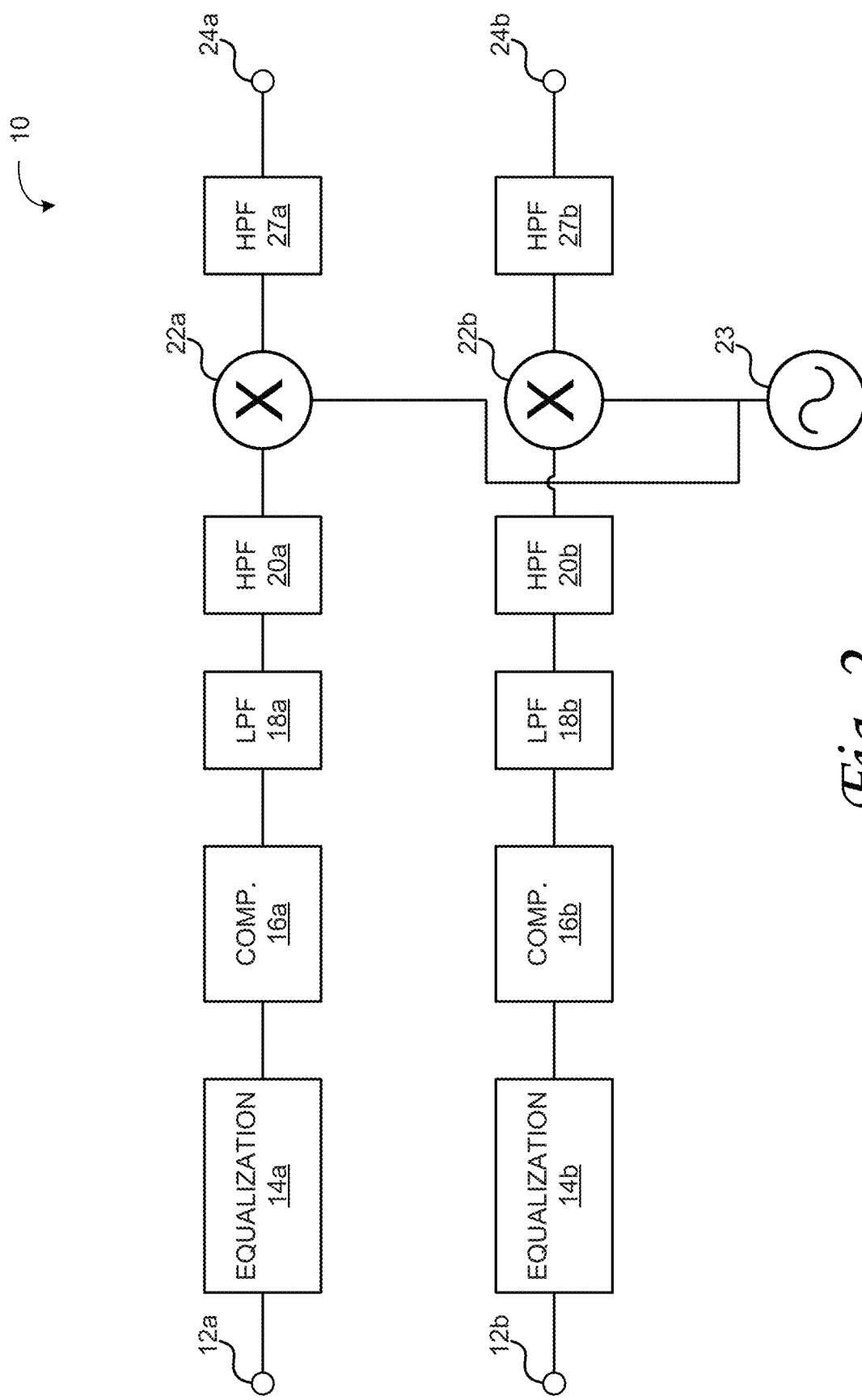
FIG. 2 is a diagram illustrating an example of a signal processing system that is suitable for use with the emitter technology described herein.

One example of a signal processing system 10 that is suitable for use with the technology described herein is illustrated schematically in FIG. 2. In this embodiment, various processing circuits or components are illustrated in the order (relative to the processing path of the signal) in which they are arranged according to one implementation. It is to be understood that the components of the processing circuit can vary, as can the order in which the input signal is processed by each circuit or component. Also, depending upon the embodiment, the processing system 10 can include more or fewer components or circuits than those shown.

Also, the example shown in FIG. 1 is optimized for use in processing two input and output channels (e.g., a "stereo" signal), with various components or circuits including substantially matching components for each channel of the signal. It will be understood by one of ordinary skill in the art after reading this description that the audio system can be implemented using a single channel (e.g., a "monaural" or "mono" signal), two channels (as illustrated in FIG. 2), or a greater number of channels.

Referring now to FIG. 2, the example signal processing system 10 can include audio inputs that can correspond to left 12a and right 12b channels of an audio input signal. Equalizing networks 14a, 14b can be included to provide equalization of the signal. The equalization networks can, for example, boost or suppress predetermined frequencies or frequency ranges to increase the benefit provided naturally by an emitter/transductor (inductor) combination (not shown) of the parametric emitter assembly.

After the audio signals are equalized compressor circuits 16a, 16b can be included to compress the dynamic range of the incoming signal, effectively raising the amplitude of certain portions of the incoming signals and lowering the amplitude of certain other portions of the incoming signals. More particularly, compressor circuits 16a, 16b can be included to narrow the range of audio amplitudes. In one aspect, the compressors lessen the peak-to-peak amplitude of the input signals by a ratio of not less than about 2:1. Adjusting the input signals to a narrower range of amplitude can be done to minimize distortion, which is characteristic of the limited dynamic range of this class of modulation systems. In other embodiments, the equalizing networks 14a, 14b can be provided after compressors 16a, 16b, to equalize the signals after compression.

Low pass filter circuits 18a, 18b can be included to provide a cutoff of high portions of the signal, and high pass filter circuits 20a, 20b providing a cutoff of low portions of the audio signals. In one exemplary embodiment, low pass filters 18a, 18b are used to cut signals higher than about 15-20 kHz, and high pass filters 20a, 20b are used to cut signals lower than about 20-200 Hz.

Figure 4:
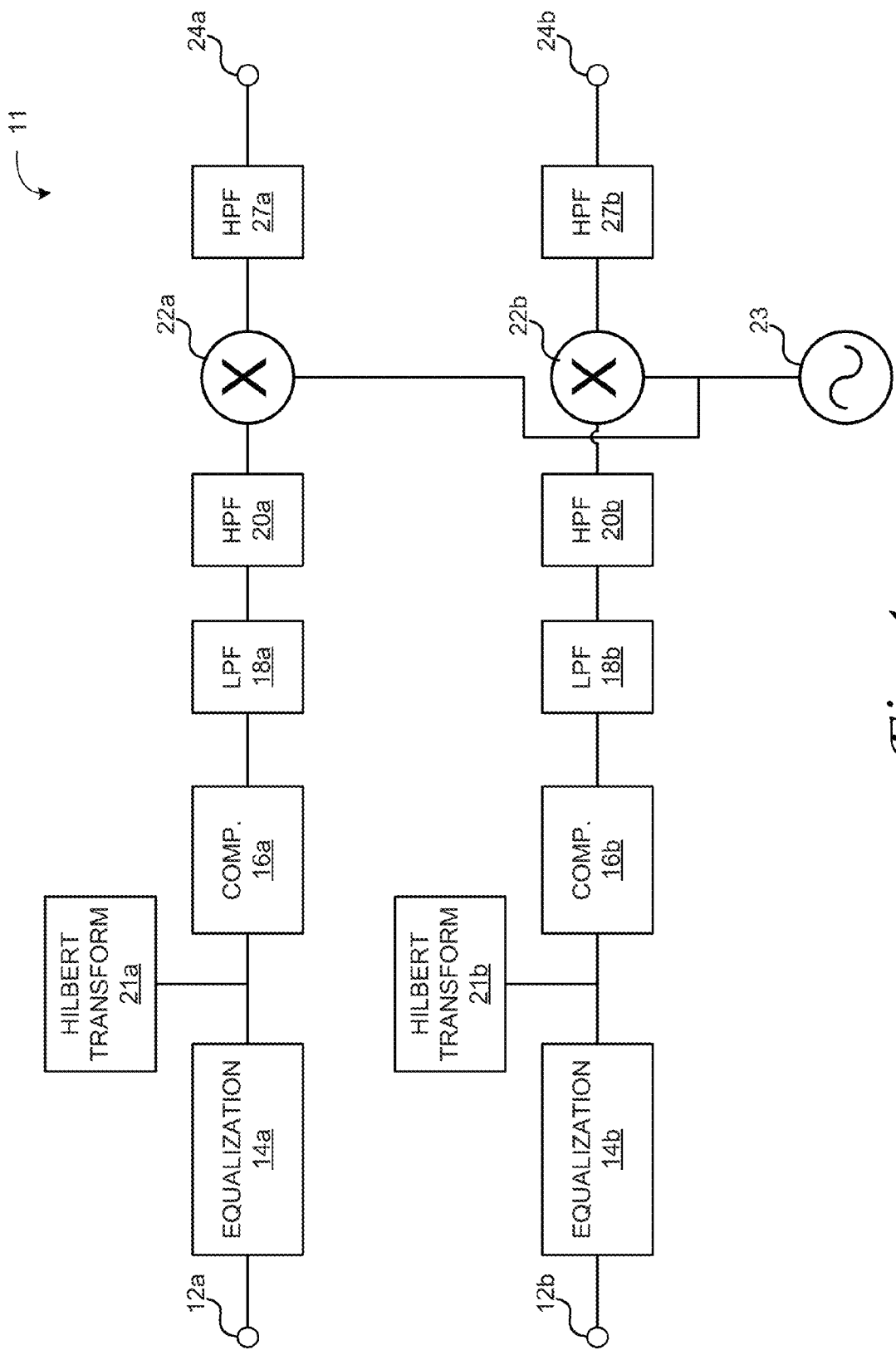
FIG. 4 is a diagram illustrating another example of a signal processing system that is suitable for use with the emitter technology described herein.

The high pass filters 20a, 20b can be configured to eliminate low frequencies that, after modulation, would result in deviation of carrier frequency (e.g., those portions of the modulated signal of FIG. 4 that are closest to the carrier frequency). Also, some low frequencies are difficult for the system to reproduce efficiently and as a result, much energy can be wasted trying to reproduce these frequencies. Therefore, high pass filters 20a, 20b can be configured to cut out these frequencies.

The low pass filters 18a, 18b can be configured to eliminate higher frequencies that, after modulation, could result in the creation of an audible beat signal with the carrier. By way of example, if a low pass filter cuts frequencies above 15 kHz, and the carrier frequency is approximately 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is within the range of human hearing.

In the example system 10, after passing through the low pass and high pass filters, the audio signals are modulated by modulators 22a, 22b. Modulators 22a, 22b, mix or combine the audio signals with a carrier signal generated by oscillator 23. For example, in some embodiments a single oscillator (which in one embodiment is driven at a selected frequency of 40 kHz to 50 kHz, which range corresponds to readily available crystals that can be used in the oscillator) is used to drive both modulators 22a, 22b. By utilizing a single oscillator for multiple modulators, an identical carrier frequency is provided to multiple channels being output at 24a, 24b from the modulators. Using the same carrier frequency for each channel lessens the risk that any audible beat frequencies may occur.

High-pass filters 27a, 27b can also be included after the modulation stage. High-pass filters 27a, 27b can be used to pass the modulated ultrasonic carrier signal and ensure that no audio frequencies enter the amplifier via outputs 24a, 24b. Accordingly, in some embodiments, high-pass filters 27a, 27b can be configured to filter out signals below about 25 kHz.

Additional examples of ultrasonic audio systems, including parametric emitters and drivers, with which the technology disclosed herein may be implemented are disclosed in U.S. Pat. No. 8,718,297, titled Parametric Transducer and Related Methods, which is incorporated herein by reference in its entirety.

As described herein, various embodiments can be configured to transmit one or more channels of audio using ultrasonic carriers. The transmission of audio using ultrasonic carriers can be used in a variety of different scenarios/contexts as will be described in greater detail below. For example, various embodiments may be utilized in or for implementing directed/targeted or isolated sound systems, specialized audio effects, hearing amplifiers/aids, as well as sound alteration.

Targeted or isolated sound systems can refer to systems that direct audio to a particular target. That is, an aforementioned HSS audio sound system can be utilized to create a "zone" of audio using an ultrasonic carrier that is highly directional. Accordingly, an audio signal modulated on an ultrasonic carrier signal can be directed to a specific target or area, where the demodulated audio signal cannot be heard outside of the intended zone of audio.

Accordingly, such targeted or isolated sound systems lend themselves to a myriad of applications. One such application may be warning or alert systems. In an emergency situation, emergency vehicles, such as police cars, ambulances, fire engines, etc., often must navigate through and around road traffic. Traditionally, such emergency vehicles notify drivers to move out of their path via loud, flashing sirens. This can create noise pollution for surrounding areas, create confusion for drivers that cannot determine whether or not they must pull to the side of a road, etc. Thus, such emergency vehicles may utilize various embodiments to direct warnings or alerts to particular vehicles in traffic or specific areas to direct the drivers of such vehicles accordingly. It should be noted that the range of a propagated ultrasonic carrier signal can be varied based on the particular ultrasonic emitter and/or ultrasonic carrier signal frequency that is utilized for transmission. Longer or shorter range transmission can be used as appropriate.

Another application may be for directing the visually impaired at crosswalks. For example, an ultrasonic sound system can be activated by a visually impaired person at a crosswalk, and the ultrasonic sound system can be used to relay instructions to the visually impaired person as he/she walks across a road or any other path where he/she might require assistance. As long as the visually impaired person can hear the directed audio instructions, he/she can be ensured that they are following the correct path and/or at the correct time to avoid an accident.

Still other applications can involve the dispersion of crowds, nuisance animals, and the like. For example, airports currently rely on auditory scarers to attempt to scare birds away from the flight path of airplanes. Current auditory scarers rely on loud explosions using, e.g., propane cannons, but such technologies can be an annoyance to people and surrounding areas. Other conventional auditory scarers rely on ultrasound emitting devices, but the usefulness of such devices is debatable as birds may not be able to hear on the ultrasonic level. For crowd dispersion, the use of megaphones, public address (PA) systems can often cause more distress and confusion rather than diffuse a situation and effectuate control. Therefore, various embodiments can be utilized to again, direct audio modulated on an ultrasonic carrier to target specific areas, such as airports, the roofs of buildings, people, animals, etc. without the negative repercussions of conventional technologies.

Other contexts in which isolated sounds systems have value is in confined areas, such as hotel rooms, bedrooms, automobiles, and the like. For example, various embodiments may be utilized to direct audio to an intended receiver or target while excluding unintended receivers from hearing the audio in the same space. Accordingly, an ultrasonic emitter can be implemented as part of one or more sources of audio, such as television, stereo system, etc. for directing audio to an intended listener in a bedroom so that another, e.g., sleeping, person in the bedroom need not be disturbed. Alarm clocks may also incorporate the technologies described herein to direct audible alarms to only an intended party. In vehicles, ultrasonic emitters can be utilized to direct audio signals to particular passengers or areas of the vehicle. For example, directions from a navigation system can be directed solely to a driver of the vehicle, leaving other passengers undisturbed. Additionally, passengers in a vehicle can enjoy separate entertainment media without the need for headphones to isolate themselves. Further expanding on the utility of various embodiments, described herein, conferences or other speaking engagements that may require the translation of speech into different languages can utilize ultrasonic emitters that transmit directed audio in different languages to the appropriate attendees.

Areas where discretion or quiet is preferable can take advantage of various embodiments as well. For example, churches, museums, libraries, theaters, performance venues, etc., can provide auditory signals for various purposes without fear of disturbing the environment. Such areas may also require limited signage or have limited visibility, such as a darkened movie theater or opera venue. Accordingly, ultrasound emitters can be utilized to discreetly direct patrons to seating, for example. Further still, actors, directors, and/or other types of performers can also take advantage of various embodiments described herein, where verbal cues, instructions, or other auditory signals or sounds can be directed to an intended target unbeknownst to audience members. In fact, the acoustical properties of such venues may even be improved through the use of the technologies described herein, as conventional issues such as reverberation, echo, interference, and the like can be avoided with directional/targeted audio.

Such isolated sound systems can also be extremely useful in situations where there is heavy noise traffic, such as in areas with multiple media systems/audio sources that conventionally, would interfere with each other, e.g., casinos, hospital wards, airports, sports bars, family rooms, video game arcades, and the like. For example, various embodiments may be used to isolate audio from televisions to patients in hospital beds that may only be separated by a screen, and kiosks, status monitors in airports, or ATMs that provide directions, instructions, generalized information, personalized information to users. Such isolated sounds systems can also be leveraged in personal computing devices, such as tablet PCs, mobile devices, such as cellular phones, smart phones, PDAs, etc. to provide privacy for users and avoid disturbing nearby people. Even devices traditionally aimed at isolating audio such as a headphones, earbuds, and the like can leak audio, and therefore, various embodiments can be utilized to improve the performance of such devices.

Another area where targeted audio can be applied is in advertising and marketing. Targeted audio, whether in the form of advertisements, informational messages, or the like can be directed to specific areas of a retail establishment, shopping center, or to particular patrons/customers. For example, as a customer walks through particular aisles of a grocery store, or as potential customers pass by establishments, advertising messages can be directed to them, i.e., digital signage. Point of sale (POS) devices, such as electronic payment devices, vending machines, and the like can all be enhanced with targeted audio, such as again, advertising, informational/instructional messages, etc. It should be noted that the aforementioned advantages previously described can also act to enhance advertising, such as making it less intrusive, making it more effective by targeting a more appropriate consumer rather than relying on, e.g., general announcements.

Still other uses of the technologies described herein include generating specialized audio effects and altering sound characteristics. For example, an array of ultrasonic emitters configured in accordance with various embodiments may directionally "sweep" one or more audio signals over an audience at a performance venue to provide different sound effects. Likewise, gaming consoles/systems, may utilize various technologies described herein to provide, e.g., a more realistic and/or more immersive sound environment during gameplay by optimally directing audio about a user. The directionality of audio provided by various embodiments can be used to bounce or reflect audio signals to simulate audio sources from various locations without, produce special effects, etc.

Moreover, various technologies described herein can also be applied to hearing aids or other assistive hearing devices. For example, demodulation of an audio-encoded ultrasonic carrier signal can be accomplished within a listener's skull or within the listener's inner ear. In particular, a hearing response profile of a listener to an audio modulated ultrasonic carrier signal can be determined, and audio content can be adjusted to at least partially compensate for the listener's hearing response profile.

Various embodiments may also be utilized to provide auditory feedback to a speaker. For example, voice can be fed back to a speaker's ears using an ultrasonic emitter that varies the audio signal(s) representative of the speaker's voice to cause the speaker to speak for more loudly or more quietly.

Still other embodiments are directed to the use of ultrasonic emitters, such as those herein described, where the amplitude of the ultrasonic carrier signal can be adjusted in accordance with the modulating audio signal to achieve audio/dynamic range compression and lower distortion and/or remove noise, such as hiss.

In order to avoid distortion, at most, the modulating audio signal voltage should be, at maximum, equal to that of the ultrasonic carrier signal voltage. The relationship between the modulating audio signal voltage ($V_{MOD}$) and the ultrasonic carrier signal voltage ($V_{CS}$) can be referred to as the modulation index m, where $$m = V_{MOD}/V_{CS}$$

These are the peak voltage values of the modulation audio signal and the unmodulated carrier signal voltage.

Multiplying the modulating index m by 100 gives the percentage of modulation or modulation depth. When the audio signal power is increased such that the modulation index exceeds 1, distortion products can overwhelm desired signal, which is undesirable.

From a drive or bias voltage perspective, emitters may have a finite drive. In other words, emitters may be driven up to some preconfigured, total peak-to-peak voltage, with the ultrasonic carrier being allocated a fixed portion of that total peak-to-peak voltage. For example, if an ultrasonic emitter (e.g., as described in U.S. Pat. No. 8,718,297, titled Parametric Transducer and Related Methods, which is incorporated herein by reference in its entirety) is driven with a bias voltage of 300 V, 150 V of the 300 V is reserved for the ultrasonic carrier signal, while the remaining 150 V is reserved for the audio signal, resulting, again, in a modulation index of 1.

Figure 3:
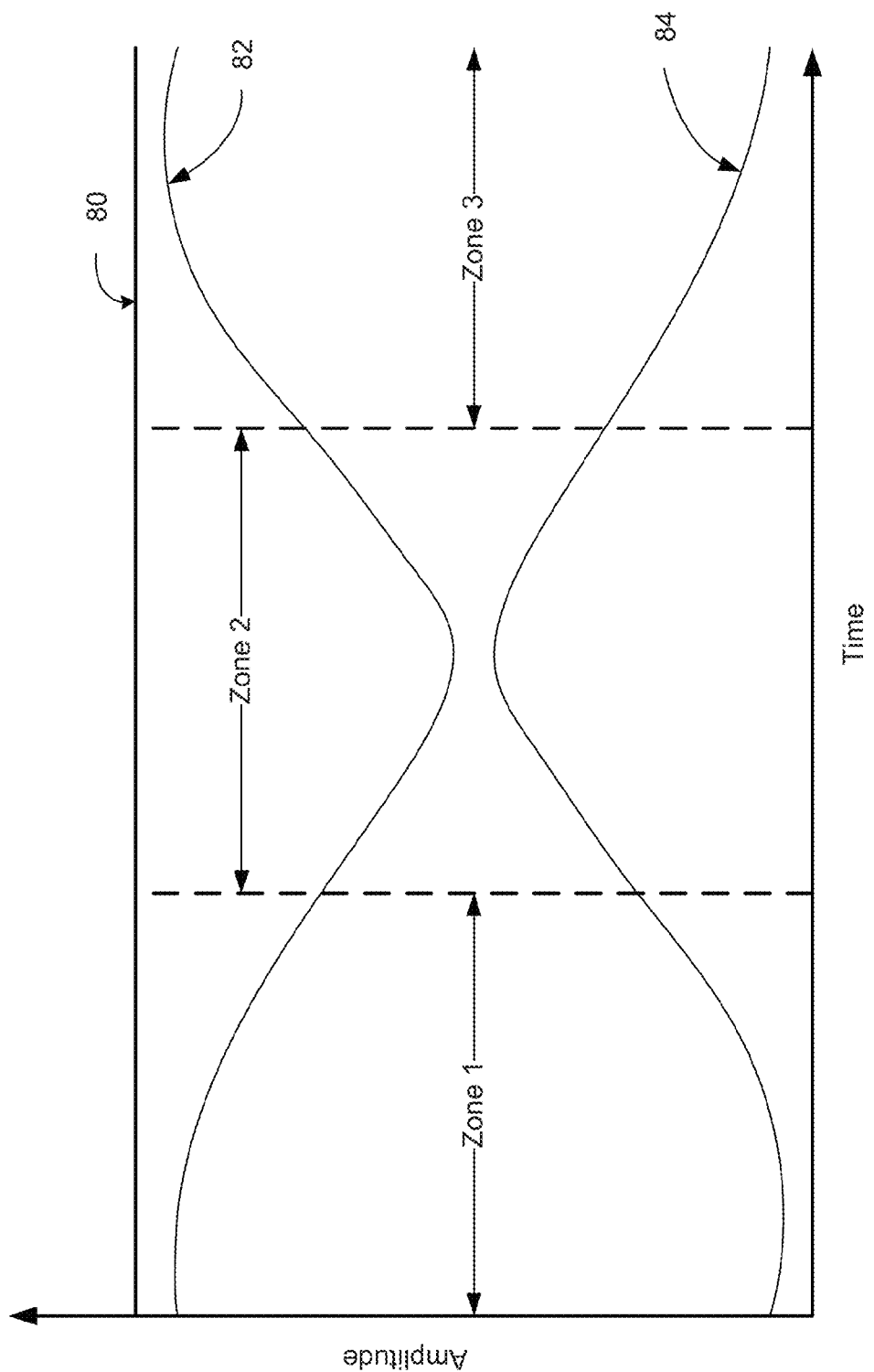
FIG. 3 is a diagram illustrating an example scenario in which adaptive carrier signal amplitude can be implemented in accordance with one embodiment of the technology described herein.

Referring to FIG. 3, the total drive+bias voltage can be represented as having given amplitude 80, with the ultrasonic carrier signal being depicted as waveform 82 and the audio signal can be modulated onto the carrier being depicted as waveform 84. At their maximum, the lower and upper sidebands (produced by audio signal 84) may require up to (or near) the maximum available voltage to drive the emitter (e.g., when the audio signal is high/loud). This can be seen, for example, at Zone 2. However, at portions of the audio signal where, for example, the volume is low/quiet, the audio output goes down. Therefore, and given the finite drive aspect of emitters, power that is not being used becomes available from the carrier signal. This can be seen at, for example, Zones 1 and 3. That is, not all of the available $V_{MOD}$ is needed for the audio signal.

For example, during a low audio portion of the modulating audio signal, only 60 V may be needed to drive the emitter. Accordingly, 90 V or 60% of the total available drive voltage is still available to drive the emitter while remaining within the total peak-to-peak voltage up to which the emitter can be driven (e.g., 300 V). Utilizing this remaining voltage to raise the ultrasonic carrier signal voltage (by 60%) for driving the emitter results in a form of dynamic range compression, whereby the volume of the output may be slightly increased (but not to the extent when, e.g., the maximum $V_{MOD}$ is being used), thereby amplifying the lower-level signals. The practical effect of this would be increased perception of detail in the audio content. Moreover, the modulation depth would be lowered (in this case to 60%, i.e., 90/150), thereby achieving lower distortion.

Accordingly, the modulating audio signal can be tracked and the carrier amplitude can be adjusted as appropriate using an iterative algorithm so that this available power can be used when the modulating audio signal is not at its maximum. Eliminating one of the aforementioned sidebands can eliminate a significant amount of distortion, e.g., more than half, in an ultrasonic sound system, such as the example ultrasonic sound system 1 of FIG. 1. Therefore, in accordance with one embodiment, a Hilbert transform may implemented prior to modulation in order to introduce a phase shift of the audio signal. In effect, this removes the negative frequencies from a complex/analytical signal.

FIG. 4 illustrates an example signal processing system 11 (similar to signal processing system 10 of FIG. 2) which includes Hilbert transform modules 21*a*, 21*b*. It should be noted as will be apparent to one of ordinary skill in the art, the various components, such as equalizing networks 14*a*, 14*b*, compressor circuits 16*a*, 16*b*, low pass filter circuits 18*a*, 18*b*, high pass filters 20*a*, 20*b*, and Hilbert transformers 21*a*, 21*b* can be implemented using analog techniques or using signal processing and analog/digital and digital/analog converters as appropriate. The signal processing may be implemented using a digital signal processor (DSP) or a general purpose processor, or other processors such as ASICs, FPGAs and the like. Moreover, one or more buffers (not shown) may be utilized to temporarily store audio signal volume/amplitude levels for determining average audio signal levels as will be discussed in greater detail below.

The Hilbert transform can be leveraged by the iterative algorithm to achieve the aforementioned adaptive amplitude carrier signal in accordance with various embodiments. That is, and mathematically, when a constant is Hilbert transformed, a constant is returned. As a result of the audio signal being phase shifted by the Hilbert transformer, a constant, in effect a DC offset, may be added to the carrier signal. Accordingly, an audio signal input into an ultrasonic sound system may be tracked or followed, and an appropriate additive constant may be added or not/subtracted. When that audio signal is 'low,' a constant value may be added to the audio signal prior to performing the Hilbert transform. Subsequent to performance of the Hilbert transform, a resulting constant is added into/included in the carrier (i.e., as extra power). If it is determined that the modulation depth would exceed 1 (e.g., the audio signal is too 'high') no constant value is added, or a constant value is subtracted from the carrier signal.

Figure 5:
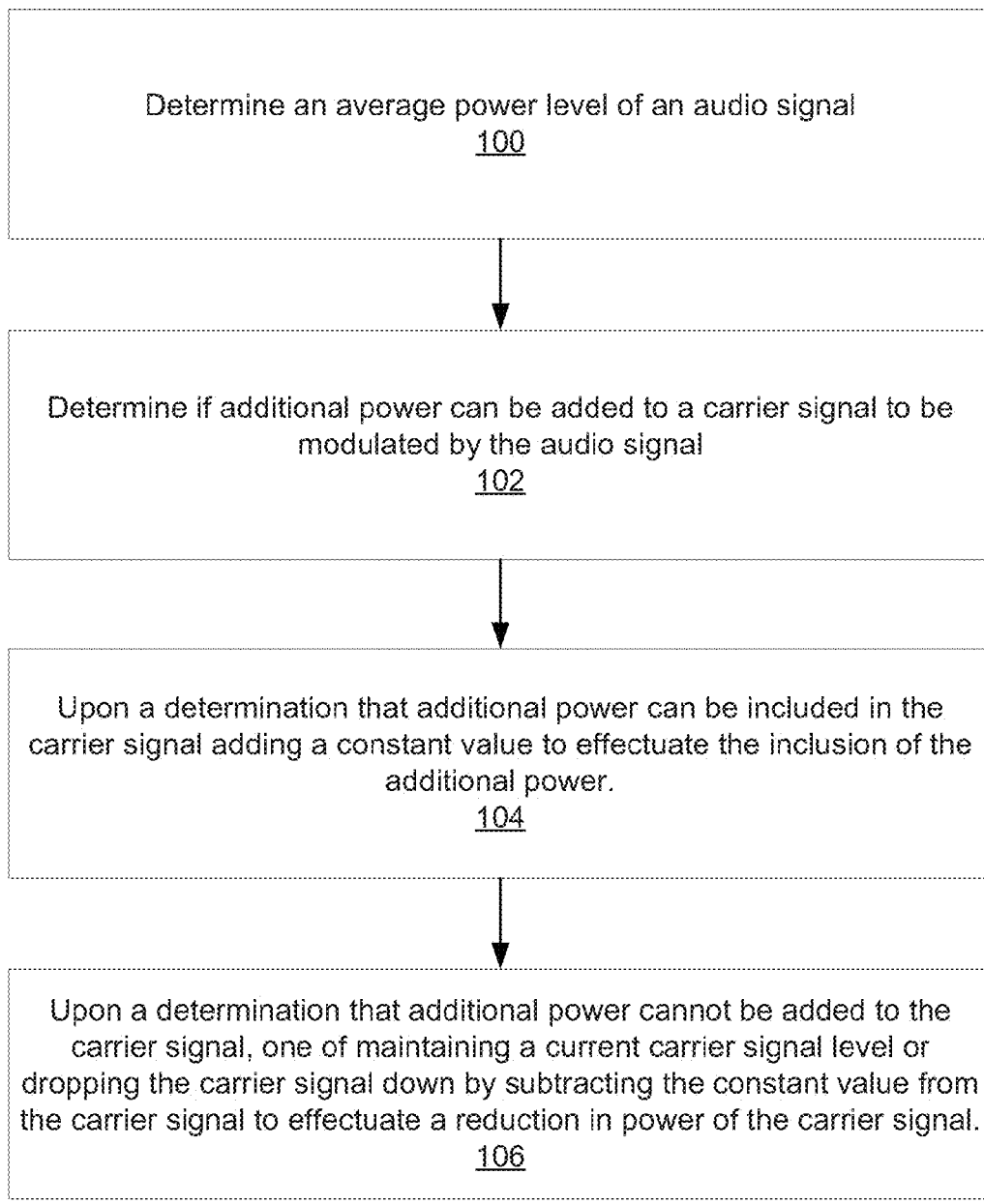
FIG. 5 is a flow chart illustrating example operations performed for adaptively adjusting the amplitude of a carrier signal in accordance with one embodiment of the technology described herein.

FIG. 5 is a flow chart illustrating example processes for dynamically adapting the amplitude of a carrier signal in accordance with one embodiment of the technology described herein. At operation 100, an average power level of an audio signal is determined. At operation 102, it is determined whether or not additional power can be added to a carrier signal to be modulated by the audio signal. It should be noted that the term power can also refer to amplitude or signal level. At operation 104, and upon a determination that additional power can be included in the carrier signal, a constant value is added to effectuate inclusion of the additional power. At operation 106, and upon a determination that additional power cannot be added to the carrier signal, either a current carrier signal level can be maintained or the carrier signal can be dropped down by subtracting the constant value to effectuate a reduction in power of the carrier signal.

In particular, the audio signal input into an ultrasonic sound system may be tracked. Tracking can involve, for example, periodically taking samples of the audio signal to determine an average audio signal level at a particular time. In accordance with one embodiment, it can be determined whether or not a constant can be added without exceeding the maximum desired modulation depth, i.e., 1, by calculating the difference between the maximum desired modulation depth of 1 and the average audio signal level (sampled at a particular time). If the maximum desired modulation depth is not exceeded, a predetermined constant value is added prior to Hilbert transformation, and the calculated difference is added to a subsequent audio signal. Another audio signal level average may then be determined for a subsequent time period to again determine whether the maximum desired modulation depth would be exceeded. This iterative process can be repeated until it is determined that the maximum desired modulation depth would be exceeded by the introduction of additional power to the carrier. This effectuates a running average audio signal level that can maintain the average audio signal level closer to the ceiling (i.e., m=1) with a commensurately additive constant value.

With regard to the additive constant, a predetermined value can be utilized beginning with a value of, e.g., 0, which can be incrementally increased by, e.g., 0.01. This allows gain to be added slowly rather than quickly, thereby avoiding the potential to over-modulate and introduce unwanted audio and/or distortion. It should be noted however, that the additive constant can be adjusted in terms of, e.g., beginning value and subsequent incremental steps. Hence, this iterative algorithm can be thought of as an adaptive dynamic range compression algorithm that amplifies low/quiet audio by compressing the audio signal's dynamic range. Moreover, attack and release controls may be incorporated such that the addition of extra bandwidth to the carrier signal is slight, e.g., 5-10 Hz. However, if the ceiling is reached/exceeded, the attack and release controls may drop the power down more sharply, for example. It should be noted that in contrast to conventional compression methods/algorithms, the constant value is 'added' rather than providing a multiplicative gain.

It should be noted that the aforementioned method of tracking and incremental addition of power is only one contemplated method for ultimately manipulating a carrier signal. In accordance with another embodiment, excess power that is available may be tracked, wherein the carrier power can be adjusted directly during or after modulation rather than prior to modulation as previously described.

Noise in audio, recording, and/or broadcast systems hiss can refer to residual low-level sound that is usually heard during quiet portions of audio. In the context of digital audio, hiss can refer to quantizing errors (e.g., when digital data representing quantized amplitude values is used to reconstruct samples for playback, and an audio sample falls above or below a quantizing level). In HSS, the background noise level tracks with the carrier level. In accordance with another embodiment, instead of 'adding' a DC offset to the carrier signal, it may be subtracted (e.g., effectuated by a sign change). That is, and in contrast to the embodiment discussed above, where the desired effect is to raise the carrier signal, the desired effect here is to reduce the presence of noise, such as hiss, by maintaining the carrier signal at a low level when the audio levels are also low. In other words, and instead of slightly increasing the volume of the output, thereby amplifying the lower-level signals, the lower-level signals (which may include hiss) may be slightly suppressed. Hence, background noise can be reduced. The audio level can be modified up slightly to compensate for the lower carrier level to maintain the desired output level. As an example, a desired output represented as 30V out of a possible 150V (a quiet signal) which normally would be accompanied by 150V of carrier can be considered. If the carrier level drops in half, i.e., to 75V, the total output for this quiet signal would also be cut in half. To remedy this, the audio signal can be doubled from 30V to 60V. The net result (60V of sideband with 75V of carrier) results in the same audible listening level but with the desired result of less noise.

In accordance with yet another embodiment, audio levels can be increased 'transiently' without running afoul of regulatory (ultrasound) noise restrictions. For example, the Occupational Health and Safety Association (OSHA) has promulgated ultrasonic noise standards that are based upon ceiling/maximum noise levels over some period of time, e.g., 8 hours. That is, such ultrasonic noise standards are based on time-weighted average (TWA) values. Accordingly, raising the carrier signal (as previously described) can be performed occasionally such that output volume may be increased, thereby amplifying the audio signals briefly, without exceeding the TWA ceiling (over time). Accordingly, the 'punchiness' of audio can be increased without exceeding TWA ultrasonic output.

It should be noted that although various embodiments described herein have been provided in the context of an ultrasonic carrier signal, other contemplated embodiments need not be limited to carrier signals in the ultrasonic audio range. Rather, the systems and methods described herein may be adapted for use with various types of carrier signals/emitters.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
    determining an average power level of an audio signal; and
    determining if additional power can be added to a carrier signal to be modulated by the audio signal, the additional power coming from at least a portion of unused surplus of drive voltage, wherein upon a determination that additional power can be included in the carrier signal, adding the additional power for at least one of increasing modulation depth, increasing volume of lower amplitude portions of the audio signal, and lowering distortion, and wherein upon a determination that power cannot be added to the carrier signal, one of maintaining a current carrier signal level or dropping the carrier signal level down for at least one of lowering modulation depth and avoiding overloading of an emitter driven by the drive voltage.

2. The method of claim 1, wherein the determining of the average power level comprises sampling a first portion of the audio signal and determining the average power level of the first portion of the audio signal.

3. The method of claim 2, further comprising calculating a first difference between a maximum modulation depth and the average power level of the first portion of the audio signal.

4. The method of claim 3, further comprising:
    adding the first difference to a second portion of the audio signal and determining a second difference between a maximum modulation depth and the average power level of the second portion of the audio signal.

5. The method of claim 1, wherein adding the additional power comprises adding a constant value to the carrier signal and wherein dropping the carrier signal level comprises subtracting the constant value from the carrier signal.

6. The method of claim 5, wherein the constant value is incrementally increased until the determination that additional power cannot be included in the carrier signal.

7. The method of claim 5, wherein the constant value comprises a predetermined DC offset.

8. The method of claim 1, wherein the carrier signal comprises an ultrasonic carrier signal that upon being modulated by the audio signal is output from an electrostatic emitter.

9. The method of claim 1, further comprising: subtracting a constant value from the carrier signal as a DC offset to effectuate a reduction in power of the carrier signal to reduce noise.

10. The method of claim 9, further comprising: increasing the power level of the audio signal to compensate for the reduction in power of the carrier signal to reduce noise.

11. A non-transitory computer-readable medium having computer executable program code embodied thereon, the computer executable program code configured to cause a computer system to:
sample consecutive portions of an audio signal for modulating an ultrasonic carrier signal;
determine an average power level of each of the consecutive portions of the audio signal; and
determine if additional power can be added to the ultrasonic carrier signal at each of the consecutive portions of the audio signal, the additional power coming from at least a portion of unused surplus of drive voltage, wherein upon a determination that additional power can be included in the carrier signal, adding the additional power for at least one of increasing modulation depth, increasing volume of lower amplitude portions of the audio signal, and lowering distortion, and wherein upon a determination that power cannot be added to the ultrasonic carrier signal, one of maintaining a current ultrasonic carrier signal level or dropping the ultrasonic carrier signal level down for at least one of lowering modulation depth and avoiding overloading of an emitter driven by the drive voltage.

12. The non-transitory computer-readable medium of claim 11, wherein to determine if additional power can be added to the ultrasonic carrier signal at each of the consecutive portions of the audio signal, the computer executable program code is configured to further cause the computer system to calculate a difference between a maximum modulation depth and the average power level of each of the consecutive portions of the audio signal.

13. The non-transitory computer-readable medium of claim 12, wherein the computer executable program code is configured to add the difference to a subsequent one of the consecutive portions of the audio signal prior to the determination of the average power level thereof.

14. The non-transitory computer-readable medium of claim 11, wherein the computer executable program code configured to cause the computer system to add the additional power comprises causes the computer system to add a constant value to the carrier signal and wherein the computer executable program code configured to cause the computer system to drop the carrier signal level causes the computer system to subtract the constant value from the carrier signal.

15. The non-transitory computer-readable medium of claim 14, wherein the constant value comprises a predetermined DC offset.

16. The non-transitory computer-readable medium of claim 14, wherein the computer executable program code is configured to further cause the computer system to incrementally increase the constant value until the determination that additional power cannot be included in the carrier signal is reached.

17. The non-transitory computer-readable medium of claim 14, wherein the computer executable program code is configured to further cause the computer system to perform a Hilbert transformation of the constant value prior to the modulating of the ultrasonic carrier signal such that portions of the audio signal where the corresponding power levels are low experience increased power from the ultrasonic carrier signal.

18. The non-transitory computer-readable medium of claim 11, wherein the computer executable program code is configured to further cause the computer system to output the ultrasonic carrier signal from an electrostatic emitter upon being modulated by the audio signal.

19. The non-transitory computer-readable medium of claim 11, wherein the computer executable program code is configured to further cause the computer system to subtract a constant value from the carrier signal as a DC offset to effectuate a reduction in power of the carrier signal to reduce noise.

20. The non-transitory computer-readable medium of claim 19, wherein the computer executable program code is configured to further cause the computer system to increase the power level of the audio signal to compensate for the reduction in power of the carrier signal to reduce noise.

* * * * *